United States Patent [19]

Ogawa

[11] Patent Number: 4,553,107
[45] Date of Patent: Nov. 12, 1985

[54] CURRENT MIRROR CIRCUIT HAVING STABILIZED OUTPUT CURRENT

[75] Inventor: Atsushi Ogawa, Yokohama, Japan

[73] Assignee: Tokyo Shibaura Denki Kabushiki Kaisha, Kawasaki, Japan

[21] Appl. No.: 557,254

[22] Filed: Dec. 2, 1983

[30] Foreign Application Priority Data

Dec. 3, 1982 [JP] Japan .................. 57-212152

[51] Int. Cl.$^4$ .................................. H03F 3/68
[52] U.S. Cl. ........................ 330/288; 330/257; 330/311
[58] Field of Search ............ 330/257, 288, 311; 323/315, 316

[56] References Cited

U.S. PATENT DOCUMENTS 4,147,992 4/1979 Davis .................. 330/288
4,410,859 10/1983 Kuwahara .............. 330/311 X

FOREIGN PATENT DOCUMENTS 1906213 9/1969 Fed. Rep. of Germany .
2249645 4/1973 Fed. Rep. of Germany .
2416680 10/1974 Fed. Rep. of Germany .

Primary Examiner—Eugene R. LaRoche
Assistant Examiner—Steven J. Mottola
Attorney, Agent, or Firm—Finnegan, Henderson, Farabow, Garrett & Dunner

[57] ABSTRACT

A current mirror circuit having a good input-output current characteristic and operable by a relatively small power supply voltage. The current mirror circuit includes a first resistor connected to a current input circuit, a first transistor whose emitter is connected to the junction of the first resistor and the current input circuit, means for providing a voltage offset, a second resistor connected in series with the base of the first transistor through the voltage offset providing means, a first constant current source connected to the collector of the first transistor, a second constant current source connected to the junction of the base of the first transistor and the voltage offset providing means, and a second transistor whose base is connected to the collector of the first transistor and whose emitter is connected to the junction of the voltage offset providing means and the second resistor to provide a feedback loop. The output current of the current mirror circuit is taken from the collector of the second transistor.

9 Claims, 7 Drawing Figures

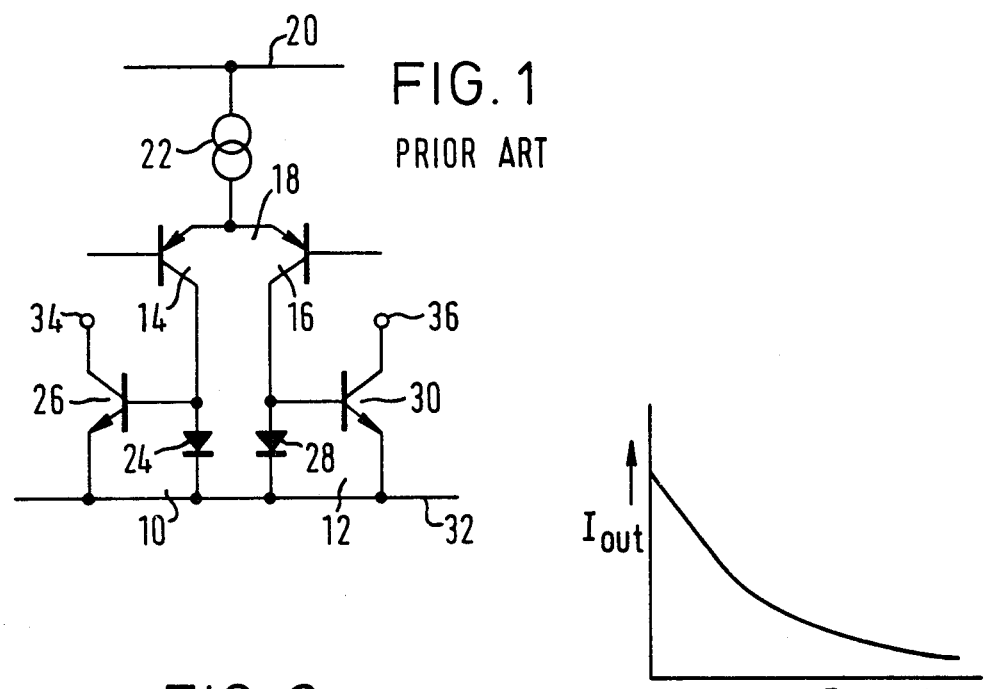
FIG. 1 PRIOR ART
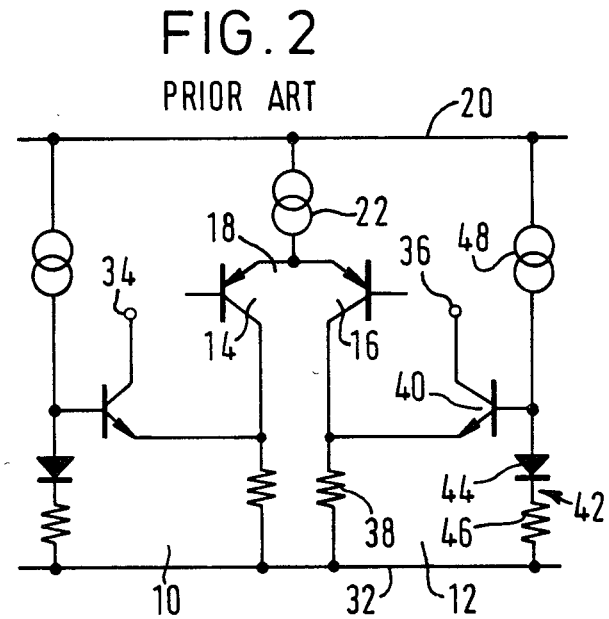
FIG. 2 PRIOR ART
FIG. 3 PRIOR ART

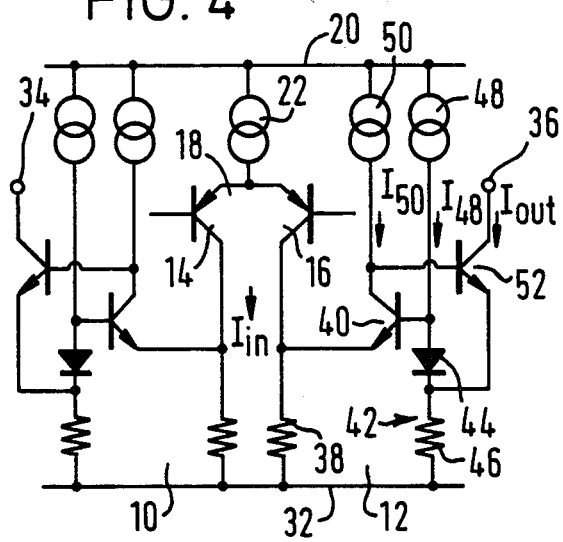
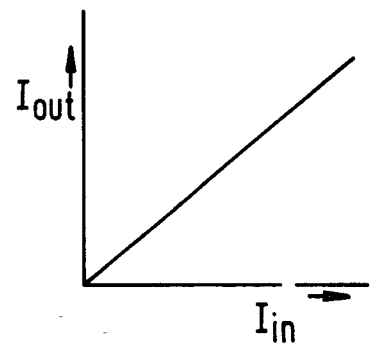
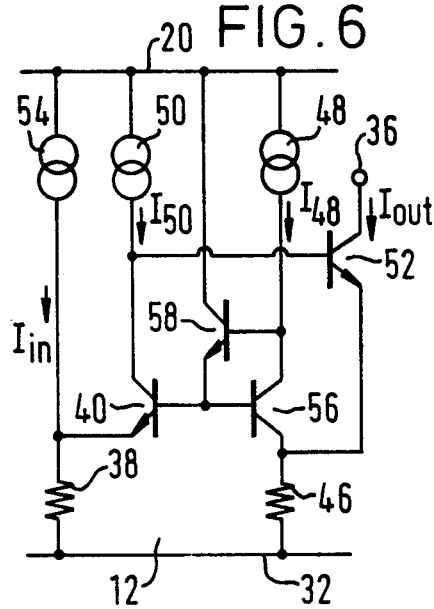
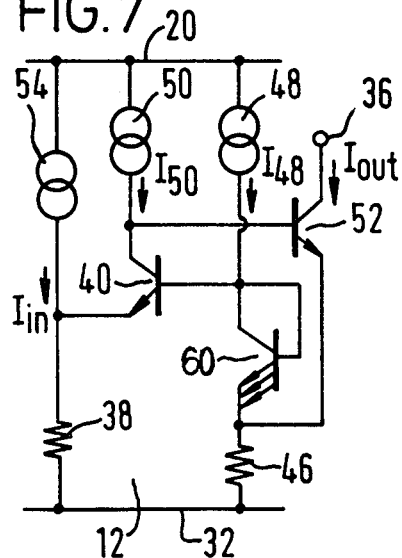

CURRENT MIRROR CIRCUIT HAVING STABILIZED OUTPUT CURRENT

BACKGROUND OF THE INVENTION

This invention relates to a current mirror circuit, and more particularly, to circuits which have linear input-output characteristics and operate at a low supply voltage.

DESCRIPTION OF THE PRIOR ART

Current mirror circuits are well known in the art as a means for supplying a known current and have many aplications, especially in integrated circuits, and many forms of these circuits have been developed. Fundamentally, the current mirror circuit is the circuit which works to supply an output current responsive to its known input current.

As is well known, current mirror circuits are essential for stable processing of various types of signals. A requirement for current mirror circuits is that they operate at a low supply voltage with low power consumption. Current mirror circuits should also ideally have good linearity of output current with respect to input current and yet have a simple circuit arrangement.

In practice, conventional current mirror circuits require a high supply voltage, which prevents their use in compact, portable electronic equipment. Much effort has been made for improving the current mirror circuits for operation with low supply voltages. However, conventional circuits operable with a low supply voltage have had a drawback that their circuit arrangements have been very complicated and the linearity of input to output characteristics has been poor.

Typical conventional current mirror circuits are shown in FIGS. 1 and 2, and are more fully discussed below in the section entitled "Description of the Preferred Embodiments".

SUMMARY OF THE INVENTION

The subject invention relates to a novel current mirror circuit which has a linear input-output current characteristic and operates at a low supply voltage.

These and the other objects referenced herein below are achieved in the current mirror circuit of this invention which as embodied and broadly described herein includes a first impedance path connected to a input current circuit, a first transistor whose emitter is connected to the junction of the first impedance path and the input circuit, means for providing a voltage offset equivalent to the base-emitter voltage of said first transistor connected to the base of said first transistor, a second impedance path connected in series with said voltage offset providing means, a first current source connected to the collector of the first transistor for producing a first current of substantially constant value, a second current source connected to said voltage offset providing means for producing a second current of substantially constant value, a second transistor whose base is connected to the collector of the first transistor, whose collector is connected to the current output, and whose emitter is connected to said junction of the voltage offset providing means and the second impedance path for producing a feedback loop to output a collector current which is substantially linearly related to said current input, the output current of the current mirror circuit being taken from the collector of the second transistor. The current sources produce currents of substantially constant values.

Accordingly, an object of the present invention is to provide a current mirror circuit which is able to operate at a low supply voltage.

Another object of the present invention is to provide a current mirror circuit which has good linear input-output characteristics.

A further object of the present invention is to provide current mirror circuit of simple construction.

Additional objects, advantages, and features of the present invention will become apparent to persons skilled in the art from a study of the following description and of the accompanying drawings, in which:

BRIEF DESCRIPTION OF THE DRAWINGS

FIG. 1 is a circuit diagram showing the basic configuration of a conventional current mirror circuit;

FIG. 2 is a circuit diagram showing an improved configuration of a conventional current mirror circuit;

FIG. 3 is a graph showing the input to output current characteristics for the circuit of FIG. 2;

FIG. 4 is a circuit diagram showing one embodiment of a current mirror circuit constructed according to the present invention;

FIG. 5 is a graph showing the input to output current characteristic according to the circuit of FIG. 4; and FIGS. 6 and 7 are circuit constructed diagrams showing other embodiments of a current mirror circuit according to the present invention.

DESCRIPTION OF THE PREFERRED EMBODIMENTS

The present invention will now be described in detail with reference to the accompanying drawings, namely, FIGS. 1 to 7. Throughout the drawings, like reference numerals and letters are used to designate like or equivalent elements for the sake of simplicity of explanation.

Referring now to FIG. 1, there is shown an example of a conventional current mirror circuit in common use in transistor circuits. FIG. 1 shows an application where current mirror circuits 10, 12 are used as collector loads for a pair of transistors 14, 16 forming differential amplifier circuit 18. The emitters of transistors 14, 16 are connected together and then connected to power supply line 20 through current source 22. The current source may be as simple as a resistor which supplies a current therethrough to a circuit connected thereto. Current mirror circuits 10, 12 are respectively made up of diode 24 and transistor 26 and diode 28 and transistor 30. Diodes 24, 28 are respectively connected in series along the collector paths of transistors 14, 16 to ground potential line 32. Transistors 26, 30 are connected at their base-emitter paths in parallel with diodes 24, 28 respectively. Collectors of transistors 26, 30 respectively form output terminals 34, 36 for respective current mirror circuit 10, 12. In this configuration, each of diodes 24, 28 needs a bias voltage of about 0.7 V (volt) and so the base potential of each of transistors 26, 30 cannot be reduced to ground level. Accordingly, power supply line 20 requires an extra bias voltage of about 0.7 V for activating current mirror circuits 10, 12. Further, the respective bases of transistors 14, 16 cannot operate at the ground level potential, because the collector-emitter voltages of the transistors are reduced to zero causing the transistors not to work under the bias condition.

FIG. 2 shows an improvement over the above-mentioned configuration of FIG. 1. In FIG. 2, current mirror circuit 12 (a second current mirror circuit 10 is shown which is the same as circuit 12) includes first resistor 38 connected in series with the collector of transistor 16, which is part of differential amplifier circuit 18, to ground potential line 32, transistor 40 whose emitter is connected to the junction of transistor 16 and first resistor 38, and series circuit 42 of diode 44 and second resistor 46 which is connected at its one end to power supply line 20 through constant current source 48 and at its other end to ground potential line 32. The constant current source is a source which supplies a relatively constant current regardless of a change of temperature or bias voltage of a circuit connected thereto. The base of transistor 40 is connected to the junction of diode-resistor series circuit 42 and constant current source 48. The collector of transistor 40 forms output terminal 36.

The circuit configuration of FIG. 2 has an advantage in that the necessary voltage drop across first resistor 38 is reduced to around 0.1 V. However, output current $I_{out}$ flowing through output terminal 36 fails to correspond linearly with input current $I_{in}$ flowing from the input circuit, that is, the current from transistor 16 in differential amplifier circuit 18 into first resistor 38.

FIG. 3 is a graph indicating a typical type of input-ouput current characteristic of a current mirror circuit 12 such as shown in FIG. 2. As seen from FIG. 3, the input-output characteristic between input current $I_{in}$ and output current $I_{out}$ is nonlinear especially at larger input current values and output current $I_{out}$ decreases while input current $I_{in}$ increases. In other words, output current $I_{out}$ is inversely related to input current $I_{in}$. Therefore, the circuit of FIG. 3 is very inconvenient for applications to other circuits.

Referring now to FIG. 4, there is shown the circuit diagram of a differential amplifier circuit using current mirror circuits constructed according to the present invention and used as collector loads. Since the invention resides in the current mirror circuit, only that portion of the differential amplifier relating to current mirror circuit 12 will be explained. Both of the current mirror circuits 10, 12 have the same construction so that only one of the current mirror circuits need be described. Differential amplifier circuit 18 is constructed similar to those of FIGS. 1 and 2 so that the description of the circuit 18 will not be repeated for the embodiment of FIG. 4.

First impedance path, here embodied as first resistor 38, is connected in series along the collector path of transistor 16 to ground potential line 32. First transistor 40 is connected at its emitter to the junction of transistor 16 and first resistor 38. First transistor 40 is further connected at its collector to power supply line 20 through first current source 50. Series circuit 42 of diode 44 and second impedance path, here embodied as second resistor 46, is connected at its one end to power supply line 20 through second constant current source 48 and at its other end to ground potential line 32. Diode 44 functions in this embodiment as a means for providing a voltage offset equivalent to the base-emitter voltage of transistor 40 and could of course also be a transistor connected in diode fashion. The base of first transistor 40 is connected to the junction of diode-resistor series circuit 42 and second current source 48. Further the emitter of second transistor 52 is connected to the junction of diode 44 and second resistor 46 in diode-resistor series circuit 42. The base of second transistor 52 is connected to the junction of first current source 50 and first transistor 40. The collector of second transistor 52 forms output terminal 36 for output current $I_{out}$. The current sources 48, 50 produce currents of substantially constant values.

In the configuration of FIG. 4, it is assumed that currents $I_{50}$ and $I_{48}$ from first and second current sources 50, 48 are of the same value and resistances $R_{38}$, $R_{46}$ of first and second resistors 38, 46 are also of the same value. That is, $$I_{50} = I_{48}$$

and $$R_{38} = R_{46}$$

It is further assumed that the base-emitter voltage of first transistor 40 and the forward voltage drop of diode 44 are each about 0.7 V. Then, both the current paths respectively comprised of first constant current source 50, first transistor 40 and first resistor 38 and second constant current source 48, diode 44 and second resistor 46 balance each other in the steady state condition. Therefore, the collector current of first transistor 40 and the current flowing through diode 44 are equal in steady state operation.

If the collector current of first transistor 40 is decreased, then the current flowing through diode 44 also will be decreased. The change in the collector current flows into the base of second transistor 52 and causes the current flowing through second transistor 52 to increase. Then, the change of the current flowing through second transistor 52 flows into second resistor 46 so that the base potential of first transistor 40 rises. The increased base potential biases first transistor 40 so that the collector current of first transistor 40 increases. Thus, second transistor 52 provides a negative feedback operation to make both the collector current of first transistor 40 and the current flowing through diode 44 balance each other.

If the current flowing through diode 44 increases then the change in the collector current of first transistors 40 is opposite to the above case. The base potential of first transistor 40 rises first so that first transistor 40 is biased to a more active condition. Therefore, the collector current of first transistor 40 is forced to increase. The increase of the collector current of second transistor 52. In other words, the base current of second transistor 52 is reduced and is biased to a less active condition so that the current flowing through second transistor 52 decreases. The decrease of the current flowing through second transistor 52 causes the current flowing through second resistor 46 to decrease. Then, the decrease of the current flowing through second resistor 46 biases first transistor 40 to a less active condition. Thus, the negative feedback operation of second transistor 52 is also accomplished in this case.

Now consider the case when the input current $I_{in}$ flowing from transistor 16 of differential amplifier circuit 18 into first resistor 38 is zero. In this case the current flowing through first resistor 38 is only the current supplied from first transistor 40, that is, current $I_{50}$ of first current source 50. Under this condition, the current flowing through second resistor 46 is controlled by the negative feedback operation of second transistor 52 to be current $I_{48}$ only, which equals $I_{50}$. Thus, the current flowing through second transistor 52 is also zero and accurately corresponds to the zero input current.

When some amount of input current $I_{in}$ flows into first resistor 38, current mirror circuit 12 operates to cause a corresponding amount of current from second transistor 52 to flow into second resistor 46, due to the negative feedback operation of second transistor 52. Therefore, output current $I_{out}$ at output terminal 36 is usually maintained equal to input current $I_{in}$ from transistor 16 in differential amplifier circuit 18.

The input-output current characteristic of current mirror circuit 12 in FIG. 4 is quite linear, because the current $I_{out}$ flowing through second transistor 52 accurately corresponds to input current $I_{in}$ flowing into first resistor 38. The current mirror circuit 12 in FIG. 4 can operate even if the voltage drop across first resistor 38 is relatively small. Therefore, current mirror circuit 12 in FIG. 4 is able to operate with a low power supply voltage. Also, the bases of transistors 14, 16 of differential amplifier 18 can operate with a bias level at the ground level potential, while the collector-emitter voltages of transistors 14, 16 are kept at a sufficient level to operate properly.

FIG. 5 is a graph which shows an idealized input-output current characteristic for a current mirror circuit 12 such as shown in FIG. 4.

Referring now to FIG. 6, there is shown another embodiment of the present invention. In FIG. 6, the numeral 54 denotes a signal input circuit. Current mirror circuit 12 in FIG. 6 is similar to the embodiment of FIG. 4 except that third and fourth transistors 56, 58 are added in place of diode 44 in this embodiment as the voltage offset providing means to compensate for the base current of first transistor 40. (For convenience and simplicity of explanation current mirror circuit 10 is not shown in FIG. 6.) Third transistor 56 is connected at its collector-emitter path between second constant current source 48 and second resistor 46 and at its base to the base of first transistor 40. Fourth transistor 58 is connected at its collector-emitter path between power supply line 20 and the junction of the bases of first and third transistors 40, 56. Thus, the base current of first transistor 40 is fed from power supply line 20 through fourth transistor 58 so that the base biasing of first transistor 40 is controlled by the voltage potential at the junction of second resistor 46 and third transistor 56. Thus, no portion of the current from second constant current source 48 flows into the base of first transistor 20 so that the linearity of the input-output current characteristic can be further improved.

Referring now to FIG. 7, there is shown a further embodiment of the present invention. Current mirror circuit 12 in FIG. 7 is similar to that in FIG. 4 except that diode 44 is replaced by fifth transistor 60 in this embodiment as the voltage offset providing means and whose emitter area is N times a large as that of first transistor 40. In the more usual case transistor 60 has a larger emitter area than that of the frist transistor 40, however, the areas of the emitters of the transistor 60 can also be smaller than that of the first transistor 40. N can therefore have a value greater or lesser than one. As a result, output current $I_{out}$ is N times as large as input current $I_{in}$. The relationships between the circuit constants $I_{50}$, $I_{48}$, $R_{38}$, $R_{46}$ etc. should be as follows.

$$I_{50}:I_{48} = 1:N$$

and $$R_{38}:R_{46} = 1:N$$

It is to be understood that the invention is not restricted to the embodiments described above and shown, and that various modifications and changes may be made therein without departing from the spirit and scope of the present invention.

What is claimed is:

1. A current mirror circuit responsive to a current input comprising:
    a first impedance path connected to said current input to receive an input current;
    a first transistor whose emitter is connected to a junction of said first impedance path and said current input;
    means for providing a voltage offset equivalent to the base-emitter voltage of said first transistor connected to the base of said first transistor;
    a second impedance path connected in series with said voltage offset providing means;
    a first current source connected to the collector of said first transistor for producing a first current of substantially constant value;
    a second current source connected to said voltage offset providing means for producing a second current of substantially constant value; and
    a second transistor whose base is connected to the collector of said first transistor, whose collector is connected to a current output, and whose emitter is connected solely and directly to the junction of said voltage offset providing means and said second impedance path for producing a feedback loop to output a collector current which is substantially linearly related to said current input.

2. The current mirror circuit according to claim 1, wherein said voltage offset providing means is a diode junction means.

3. The current mirror circuit according to claim 2, wherein said diode junction means is a diode.

4. The current mirror circuit according to claim 2, wherein said diode junction means is a third transistor connected in diode fashion.

5. The current mirror circuit according to claim 4, wherein said third transistor connected in diode fashion has an emitter of different area than that of the emitter of said first transistor.

6. The current mirror circuit according to claim 5, wherein said third transistor connected in diode fashion has an emitter area larger than that of the emitter of said first transistor.

7. The current mirror circuit according to claim 5, wherein said third transistor connected in diode fashion has an emitter area lesser than that of said first transistor.

8. The current mirror circuit according to claim 3 wherein said first and second impedance paths comprise resistors.

9. A current mirror circuit responsive to a current input comprising:
    a first impedance path connected to said current input to receive an input current;
    a first transistor whose emitter is connected to a junction of said first impedance path and said current input;
    means for providing a voltage offset equivalent to the base-emitter voltage of said first transistor connected to the base of said first transistor;

a second impedance path connected in series with said voltage offset providing means;

a first current source connected to the collector of said first transistor for producing a first current of substantially constant value;

a second current source connected to said voltage offset providing means for producing a second current of substantially constant value;

a second transistor whose base is connected to the collector of said first transistor, whose collector is connected to a current output, and whose emitter is connected to a junction of said voltage offset providing means and said second impedance path for producing a feedback loop to output a collector current which is substantially linearly related to said current input;

said voltage offset providing means comprising a third transistor connected at its collector-emitter path between said second impedance path and said second constant current source and at its base to the base of said first transistor; and a fourth transistor whose base-emitter path is connected in parallel with the collector-base path of said third transistor.

* * * * *